(12) United States Patent
Shirai et al.

(10) Patent No.: US 8,890,281 B2
(45) Date of Patent: Nov. 18, 2014

(54) SEMICONDUCTOR DEVICE

(75) Inventors: Koji Shirai, Kanagawa-ken (JP);
Mariko Shimizu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 67 days.

(21) Appl. No.: 13/493,848

(22) Filed: Jun. 11, 2012

(65) Prior Publication Data
US 2013/0187238 A1   Jul. 25, 2013

(30) Foreign Application Priority Data
Jan. 23, 2012   (JP) .................... 2012-011471

(51) Int. Cl.
*H01L 29/866* (2006.01)
*H01L 29/06* (2006.01)

(52) U.S. Cl.
CPC ........... *H01L 29/0619* (2013.01); *H01L 29/866* (2013.01)
USPC .................. 257/506; 257/409; 257/E29.013

(58) Field of Classification Search
CPC ............................ H01L 29/06; H01L 29/0619
USPC ........... 257/127, 409, 506, E29.012, E29.013
See application file for complete search history.

(56) References Cited

U.S. PATENT DOCUMENTS

| | | | | |
|---|---|---|---|---|
| 4,652,900 A | * | 3/1987 | Hashimoto | .................... 257/547 |
| 6,784,520 B2 | | 8/2004 | Doi | |
| 7,196,392 B2 | * | 3/2007 | Liu et al. | .................... 257/500 |
| 8,105,911 B2 | * | 1/2012 | Veliadis | .................... 438/356 |
| 8,659,116 B2 | * | 2/2014 | Disney et al. | .................... 257/520 |
| 8,664,715 B2 | * | 3/2014 | Disney et al. | .................... 257/335 |
| 2004/0119087 A1 | * | 6/2004 | Bose Jayappa Veeramma et al. | .................... 257/100 |
| 2008/0197445 A1 | * | 8/2008 | Disney et al. | .................... 257/506 |
| 2010/0032769 A1 | * | 2/2010 | Hao et al. | .................... 257/378 |
| 2010/0127314 A1 | * | 5/2010 | Frach | .................... 257/292 |
| 2010/0148040 A1 | * | 6/2010 | Sanfilippo et al. | ......... 250/214.1 |
| 2011/0266650 A1 | | 11/2011 | Yamaura | |
| 2012/0086099 A1 | * | 4/2012 | Yeh et al. | .................... 257/475 |

FOREIGN PATENT DOCUMENTS

JP   2004-006676   1/2004

* cited by examiner

*Primary Examiner* — Allan R Wilson
(74) *Attorney, Agent, or Firm* — Patterson & Sheridan, LLP

(57) ABSTRACT

According to one embodiment, a semiconductor device includes a first semiconductor layer of a first conductivity type, a second semiconductor layer of a first conductivity type, a third semiconductor layer of a second conductivity type, an isolation layer, and a guard ring layer of the second conductivity type. The second semiconductor layer is provided on the first semiconductor layer. The third semiconductor layer is provided on the second semiconductor layer to be joined to the second semiconductor layer. The isolation layer surrounds a periphery of the third semiconductor layer and is deeper than the third semiconductor layer. The guard ring layer is provided between the third semiconductor layer and the isolation layer, adjacent to the third semiconductor layer, and deeper than the third semiconductor layer.

19 Claims, 7 Drawing Sheets

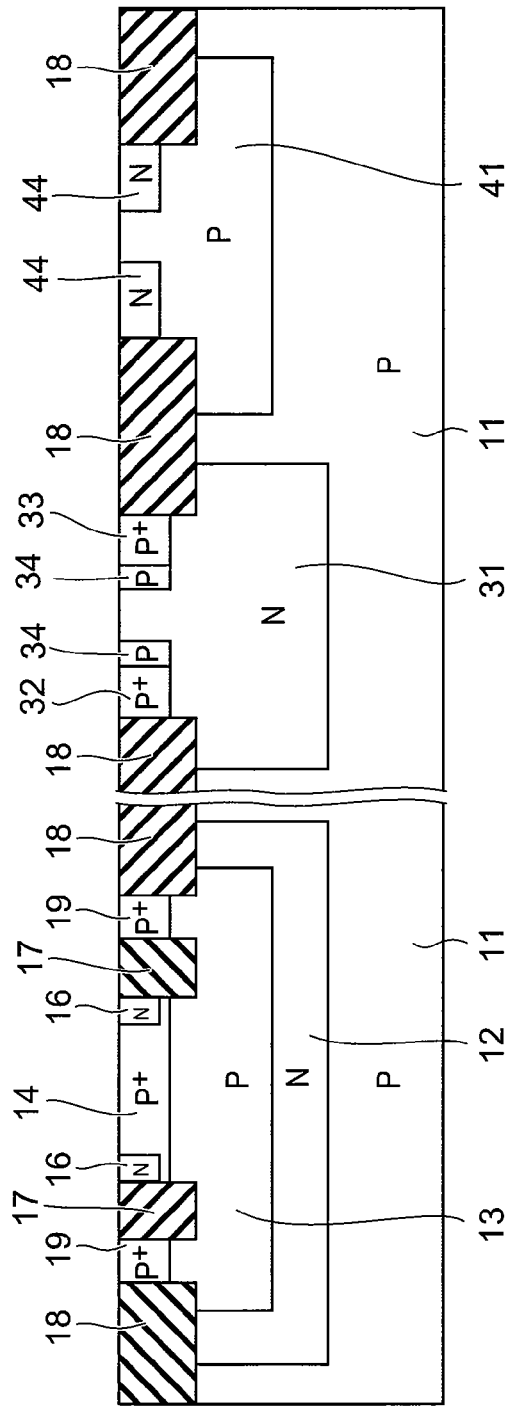
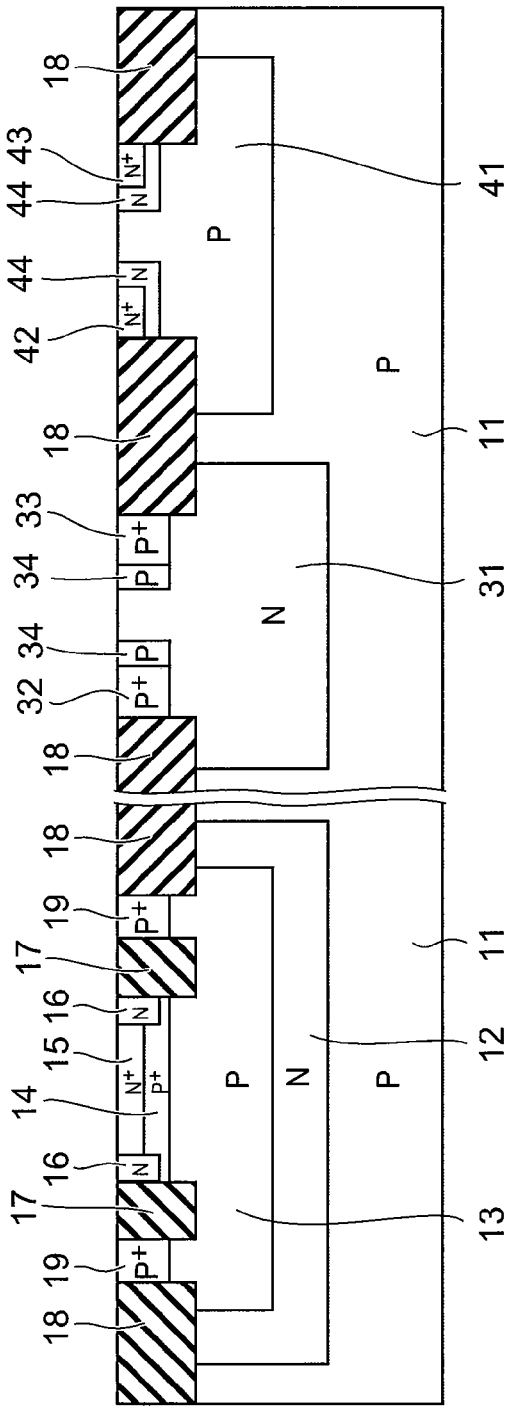
FIG. 5A
FIG. 5B

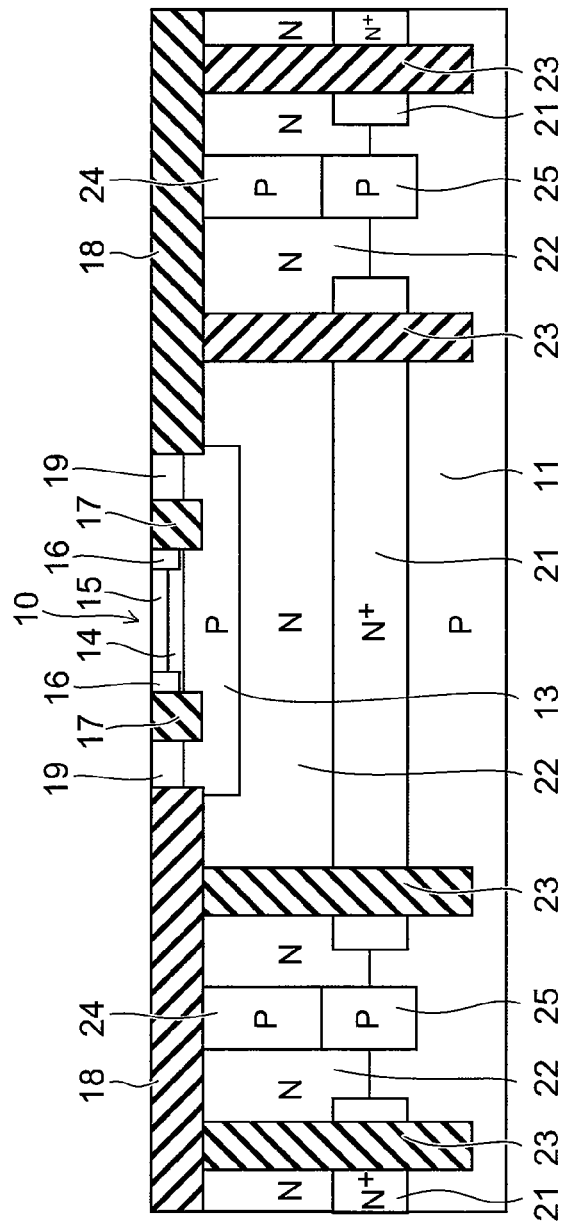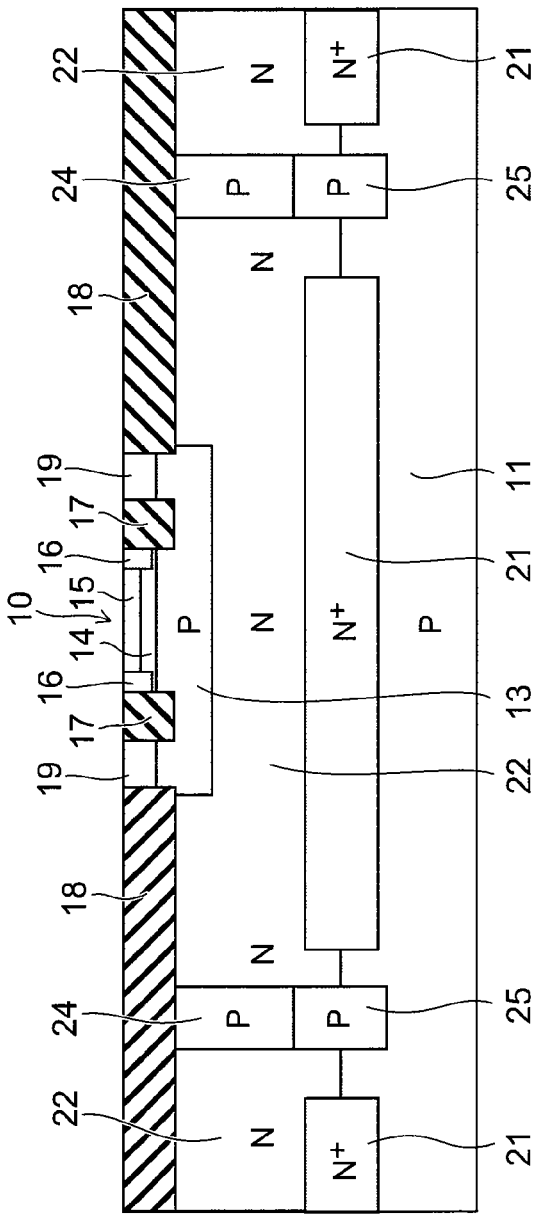
FIG. 6A
FIG. 6B

SEMICONDUCTOR DEVICE

CROSS-REFERENCE TO RELATED APPLICATIONS

This application is based upon and claims the benefit of priority from the prior Japanese Patent Application No. 2012-011471, filed on Jan. 23, 2012; the entire contents of which are incorporated herein by reference.

FIELD

Embodiments described herein relate generally to a semiconductor device.

BACKGROUND

A Zener diode exhibits constant voltage characteristics when a reverse voltage (breakdown voltage) is applied to its p-n junction. The breakdown voltage of the Zener diode can be controlled by the impurity concentration of the semiconductors forming the p-n junction.

BRIEF DESCRIPTION OF THE DRAWINGS

FIG. 4A to FIG. 5B are schematic cross-sectional view showing a method for manufacturing the semiconductor device of the fourth embodiment;

FIG. 6A is a schematic cross-sectional view of a semiconductor device of a fifth embodiment, and FIG. 6B is a schematic cross-sectional view of a semiconductor device of a sixth embodiment.

DETAILED DESCRIPTION

Figure 1A:
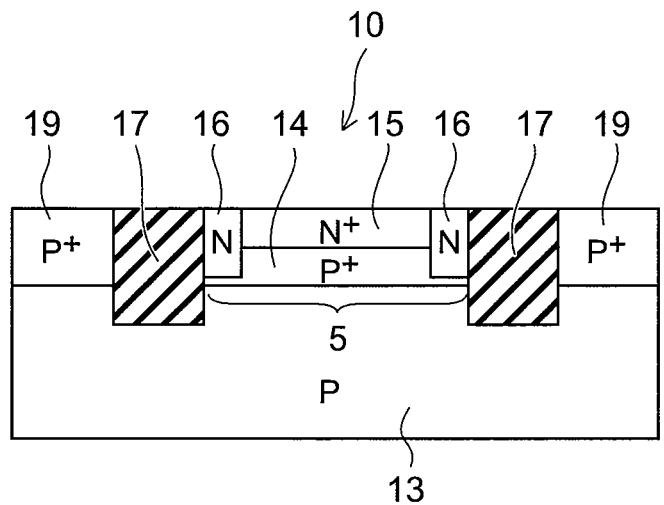
FIG. 1A is a schematic cross-sectional view of a semiconductor device of a first embodiment.

According to one embodiment, a semiconductor device includes a first semiconductor layer of a first conductivity type, a second semiconductor layer of a first conductivity type, a third semiconductor layer of a second conductivity type, an isolation layer, and a guard ring layer of the second conductivity type. The second semiconductor layer is provided on the first semiconductor layer. The third semiconductor layer is provided on the second semiconductor layer to be joined to the second semiconductor layer. The isolation layer surrounds a periphery of the third semiconductor layer and is deeper than the third semiconductor layer. The guard ring layer is provided between the third semiconductor layer and the isolation layer, adjacent to the third semiconductor layer, and deeper than the third semiconductor layer.

Various embodiments will be described hereinafter with reference to the accompanying drawings. In the drawings, identical components are marked with the same reference numerals.

Although the following embodiments are described using the p type as a first conductivity type and the n type as a second conductivity type, the first conductivity type may be the n type and the second conductivity type may be the p type.

Furthermore, although silicon is illustrated as the material of semiconductor layers and substrates in the following embodiments, a semiconductor other than silicon (e.g. a compound semiconductor such as SiC and GaN) may also be used.

First Embodiment

Figure 1B:
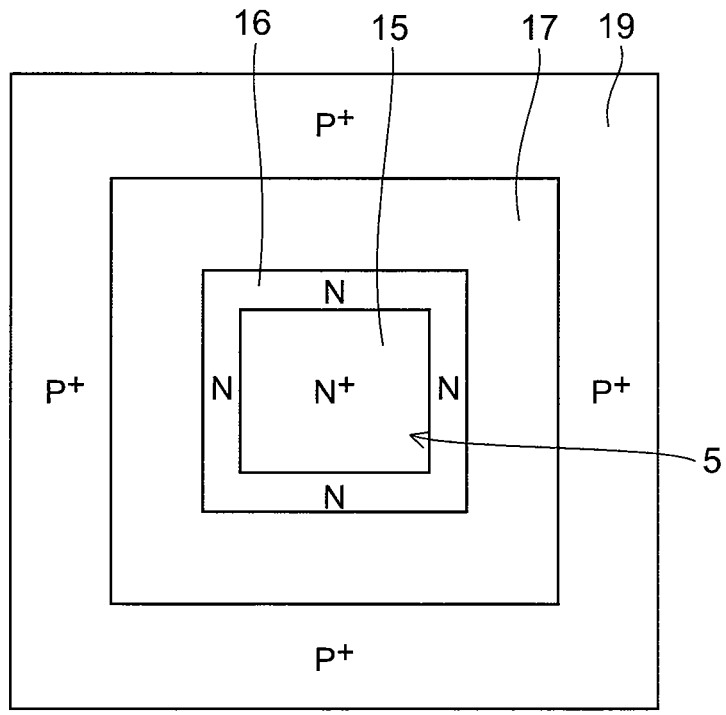
FIG. 1B is a schematic top view of FIG. 1A.

FIG. 1A is a schematic cross-sectional view of a semiconductor device of a first embodiment, and FIG. 1B is a schematic top view of FIG. 1A.

The semiconductor device of the first embodiment includes a p-type well layer 13 as a first semiconductor layer, a p-type anode layer 14 as a second semiconductor layer, an n-type cathode layer 15 as a third semiconductor layer, an n-type guard ring layer 16, and an isolation layer 17.

The p-type anode layer 14 is provided on the p-type well layer 13, and the p-type impurity concentration of the p-type anode layer 14 is higher than the p-type impurity concentration of the p-type well layer 13.

The n-type cathode layer 15 is provided on the p-type anode layer 14 to be joined to the p-type anode layer 14. The p-n junction surface between the p-type anode layer 14 and the n-type cathode layer 15 extends in directions (horizontal directions) substantially perpendicular to the stacking direction (vertical direction) of the p-type anode layer 14 and the n-type cathode layer 15.

The isolation layer 17 isolates a region 5 including the p-type anode layer 14 and the n-type cathode layer 15 from the other element regions. The isolation layer 17 has, for example, a short trench isolation structure or a shallow trench isolation (STI) structure, and has a structure in which an insulator (e.g. silicon oxide) is buried in a trench formed on the top surface side of the semiconductor device.

As shown in FIG. 1B, the isolation layer 17 continuously surrounds the periphery of the n-type cathode layer 15. As shown in FIG. 1A, the isolation layer 17 is deeper than the n-type cathode layer 15, and reaches the p-type well layer 13. Furthermore, the isolation layer 17 continuously surrounds also the periphery of the p-type anode layer 14, and is deeper than the p-type anode layer 14.

The n-type guard ring layer 16 is provided between the n-type cathode layer 15 and the isolation layer 17, and continuously surrounds the side surface of the n-type cathode layer 15 as shown in FIG. 1B. The n-type guard ring layer 16 is adjacent to the side surface of the n-type cathode layer 15 and the side surface of the isolation layer 17. The n-type impurity concentration of the n-type guard ring layer 16 is lower than the n-type impurity concentration of the n-type cathode layer 15.

The n-type guard ring layer 16 is deeper than the n-type cathode layer 15, that is, deeper than the p-n junction surface between the p-type anode layer 14 and the n-type cathode layer 15, and reaches the p-type anode layer 14.

Therefore, the n-type guard ring layer 16 is provided on the entire side surface of the n-type cathode layer 15, and the side surface of the n-type cathode layer 15 is not in contact with the p-type anode layer 14. That is, no p-n junction with the p-type anode layer 14 is formed at the side surface of the n-type cathode layer 15. The n-type guard ring layer 16 is shallower than the p-type anode layer 14 and the isolation layer 17.

The semiconductor device of the first embodiment further includes a p-type semiconductor layer 19 as a fourth semiconductor layer. The p-type semiconductor layer 19 is provided on the p-type well layer 13 on the opposite side (outside) of the isolation layer 17 from the region 5 in which the p-type anode layer 14, the n-type cathode layer 15, and the n-type guard ring layer 16 are provided.

The p-type semiconductor layer 19 is formed in the same process as the p-type anode layer 14, and has the same p-type impurity concentration as the p-type anode layer 14. Therefore, the p-type impurity concentration of the p-type semiconductor layer 19 is higher than the p-type impurity concentration of the p-type well layer 13. The p-type semiconductor layer 19 and the p-type anode layer 14 are at the same depth. No n-type semiconductor layer is provided on the p-type semiconductor layer 19 and in the p-type semiconductor layer 19.

As illustrated in FIG. 1B, the p-type semiconductor layer 19 continuously surrounds the isolation layer 17 outside the region 5. Alternatively, the p-type semiconductor layer 19 may be a striped planar pattern.

A diode having the p-n junction of the p-type anode layer 14 and the n-type cathode layer 15 is formed in the region 5 surrounded by the isolation layer 17. The diode is, for example, a Zener diode 10, and the p-type anode layer 14 and the n-type cathode layer 15 have a relatively high impurity concentration.

For example, the p-type impurity concentration of the p-type anode layer 14 and the n-type impurity concentration of the n-type cathode layer 15 are approximately $1 \times 10^{20}$ to $1 \times 10^{21}$ (cm$^{-3}$).

A not-shown plug is provided on the surface of the p-type semiconductor layer 19, and the p-type semiconductor layer 19 is electrically connected to a first electrode or an interconnection via the plug. The p-type anode layer 14 and the p-type semiconductor layer 19 are electrically connected via the p-type well layer 13, and the electric potential of the first electrode is applied to the p-type anode layer 14.

A not-shown plug is provided also on the surface of the n-type cathode layer 15, and the n-type cathode layer 15 is electrically connected to a second electrode or an interconnection via the plug.

When a relatively low potential is applied to the first electrode (anode side) and a relatively high potential is applied to the second electrode (cathode side), a reverse voltage is applied to the p-n junction of the p-type anode layer 14 and the n-type cathode layer 15. Then, a breakdown phenomenon occurs at a certain voltage (breakdown voltage), and constant voltage characteristics are obtained.

Also the n-type guard ring layer 16 is joined to the p-type anode layer 14 by p-n junction. However, the n-type impurity concentration of the n-type guard ring layer 16 is lower than the n-type impurity concentration of the n-type cathode layer 15. For example, the n-type impurity concentration of the n-type guard ring layer 16 is approximately $1 \times 10^{18}$ to $1 \times 10^{19}$ (cm$^{-3}$).

Therefore, breakdown occurs earlier at the p-n junction of the p-type anode layer 14 and the n-type cathode layer 15 than at the p-n junction of the p-type anode layer 14 and the n-type guard ring layer 16. That is, the breakdown voltage can be controlled by the control of the p-type impurity concentration of the p-type anode layer 14 and the n-type impurity concentration of the n-type cathode layer 15.

Here, comparative examples are described.

FIRST COMPARATIVE EXAMPLE

Figure 7A:
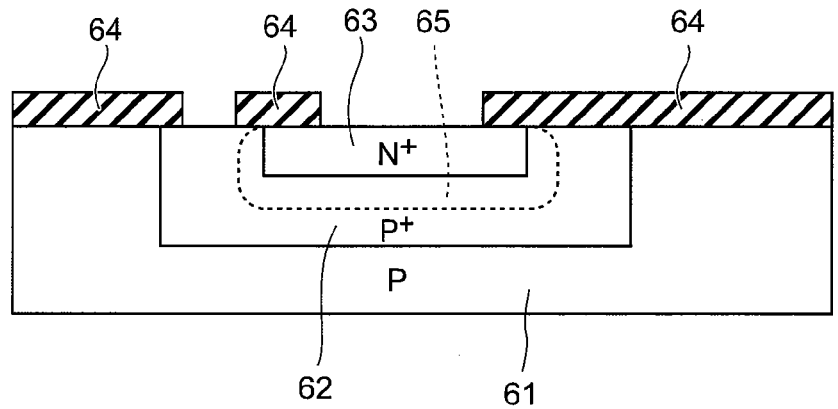
FIG. 7A is a schematic cross-sectional view of a semiconductor device of a first comparative example.

FIG. 7A is a schematic cross-sectional view of a Zener diode of a first comparative example.

In the Zener diode of the first comparative example, a p-type anode layer 62 is provided on the surface of a p-type well layer 61, and an n-type cathode layer 63 is provided on the surface of the p-type anode layer 62. The p-type anode layer 62 is provided also on the periphery of the n-type cathode layer 63, and a p-n junction with the p-type anode layer 62 is formed also at the side surface (end portion) of the n-type cathode layer 63.

In the structure of the first comparative example, it is feared that upon breakdown electrons will be trapped at the interface between the surface of the semiconductor layer and an insulating film (silicon oxide film) 64 on the surface, and a depletion layer 65 will be shortened at the surface due to the interface charge to cause a variation in breakdown voltage. To avoid the problem, the structure of a second comparative example is given.

SECOND COMPARATIVE EXAMPLE

Figure 7B:
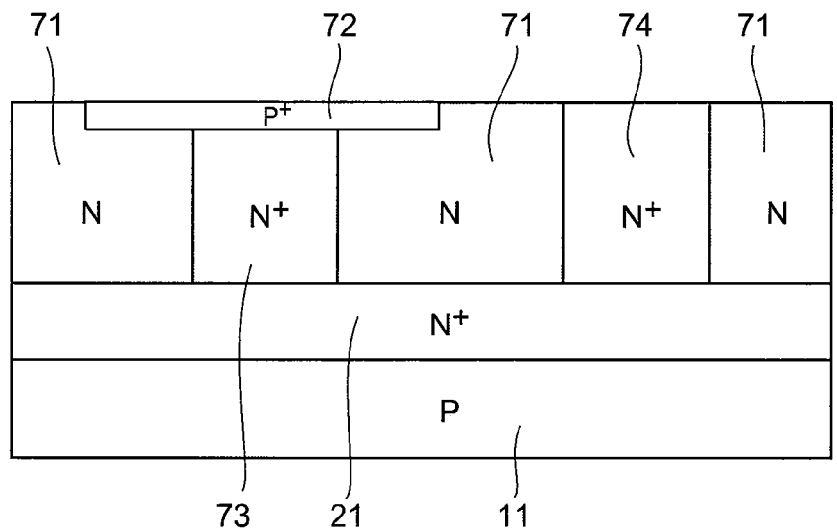
FIG. 7B is a schematic cross-sectional view of a semiconductor device of a second comparative example.

FIG. 7B is a schematic cross-sectional view of a Zener diode of a second comparative example.

The Zener diode of the second comparative example includes a p-type substrate 11, an n-type buried layer 21 provided on the p-type substrate 11, an n-type semiconductor layer 71 provided on the n-type buried layer 21 and having a lower n-type impurity concentration than the n-type buried layer 21, a p-type anode layer 72 provided on the surface of the n-type semiconductor layer 71, and an n-type cathode layer 73 provided between and in contact with the p-type anode layer 72 and the n-type buried layer 21 and having a higher n-type impurity concentration than the n-type semiconductor layer 71. An n-type semiconductor layer 74 playing a role in connection with a surface electrode on the cathode side is provided on the n-type buried layer 21 up to the surface.

The second comparative example has a structure in which a p-n junction that causes breakdown exists only directly under the p-type anode layer 72 provided at the surface. Consequently, since the n-type cathode layer 73 is provided in a position deeper than the p-type anode layer 72, a deep n-type diffusion layer is necessary, and this is likely to cause increases in element size and the time of n-type impurity diffusion.

According to the embodiment described above, a p-n junction of the p-type anode layer 14 and the n-type cathode layer 15 which causes breakdown is formed only directly under the n-type cathode layer 15 and is not formed at the periphery (side surface) of the n-type cathode layer 15. Consequently, traps of interface charge can be suppressed, and variation in breakdown voltage due to the interface charge can be suppressed.

In the second comparative example, the n-type buried layer 21 playing a role in electrically isolating the Zener diode from the substrate 11 is utilized as a connection layer for connection between the n-type cathode layer 73 and the surface electrode. Therefore, the n-type cathode layer 73 needs to be provided in a deep position in contact with the n-type buried layer 21.

On the other hand, in the embodiment, the p-type well layer 13 is formed on the top surface side of the substrate, and a stacked structure of the p-type anode layer 14 and the n-type cathode layer 15 is provided on the surface of the p-type well layer 13. The n-type cathode layer 15 is provided on the p-type anode layer 14, and is connected to the electrode on the top surface side of the device with no deep buried layer interposed. Also the p-type anode layer 14 is connected to the electrode on the top surface side of the device via the p-type well layer 13 and the p-type semiconductor layer 19 formed on the substrate surface with no deep buried layer interposed.

Therefore, in the embodiment, the element size (planar size and height) of the Zener diode can be significantly reduced as compared to the second comparative example. In a comparison between the embodiment and the second comparative example having the same characteristics, the embodiment can make the element size approximately 1/60 of that of the second comparative example.

THIRD COMPARATIVE EXAMPLE

Figure 7C:
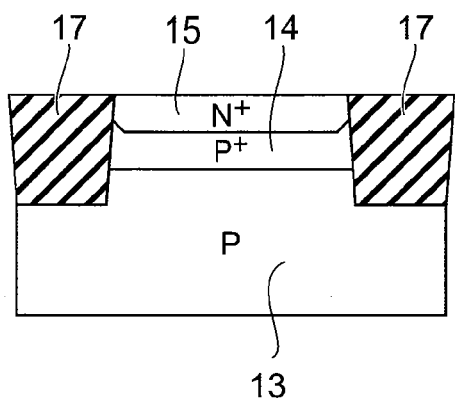
FIG. 7C is a schematic cross-sectional view of a semiconductor device of a third comparative example.

FIG. 7C is a schematic cross-sectional view of a Zener diode of a third comparative example.

The Zener diode of the third comparative example does not include the n-type guard ring layer 16 in the Zener diode 10 of the embodiment.

A trench for the isolation layer 17 of an STI structure is formed by, for example, the reactive ion etching (RIE) method. At this time, the trench width tends to be narrower on the bottom side than on the opening side, and a trench sidewall having a taper like that shown in FIG. 7C is likely to be formed.

In the case where the n-type cathode layer 15 is formed by the ion implantation method after the isolation layer 17 is formed, the upper end portion of the isolation layer 17 forms an eaves-like shape, and this obstructs ion implantation into the portion under the shade of the eaves. Therefore, the depth of the end portion on the isolation layer 17 side of the n-type cathode layer 15 is likely to be shallower than the depths of the other portions. That is, there is a concern that the p-n junction will be shallow in a portion adjacent to the sidewall (or edge) of the isolation layer 17 and a depletion layer generated in the portion will easily reach the element surface to cause a leak.

In contrast, in the embodiment, the n-type guard ring layer 16 deeper than the n-type cathode layer 15 is provided on the side surface (end portion) of the n-type cathode layer 15. Consequently, a shallow p-n junction is not formed near the sidewall of the isolation layer 17, and a leak can be suppressed.

Furthermore, by making the n-type impurity concentration of the n-type guard ring layer 16 lower than the n-type impurity concentration of the n-type cathode layer 15, the leak suppression effect near the sidewall of the isolation layer 17 can be further enhanced.

The Zener diode 10 according to the embodiment is formed on the same substrate together with other elements such as a transistor, and can be used for integrated circuits (e.g. analog integrated circuits). The embodiment is suitable for integration because a small-sized Zener diode can be formed.

A Zener diode as a component of an integrated circuit will now be illustrated. The configuration and effects of the Zener diode 10 itself including the p-type well layer 13, the p-type anode layer 14, the n-type cathode layer 15, the n-type guard ring layer 16, the p-type semiconductor layer 19, and the isolation layer 17 are the same as those of the first embodiment, and a detailed description thereof is therefore omitted.

Second Embodiment

Figure 2A:
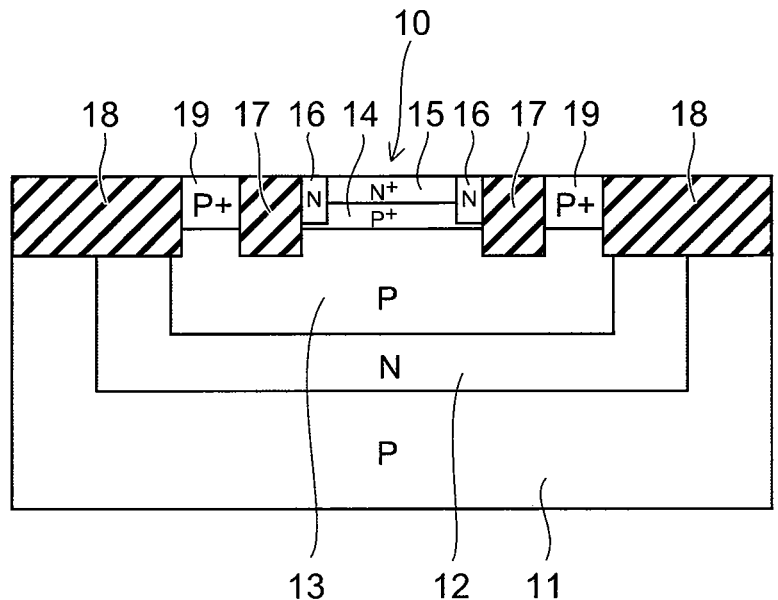
FIG. 2A is a schematic cross-sectional view of a semiconductor device of a second embodiment.

FIG. 2A is a schematic cross-sectional view of a semiconductor device of a second embodiment.

The Zener diode 10 is formed on the surface of an n-type well layer 12. The n-type well layer 12 is formed on the top surface side of the substrate (e.g. a p-type silicon substrate) 11.

Other elements such as a transistor are provided on not-shown other regions of the substrate 11. The Zener diode 10 is isolated from the other elements by an isolation layer 18 with the same structure as the isolation layer 17, for example, an STI structure.

Third Embodiment

Figure 2B:
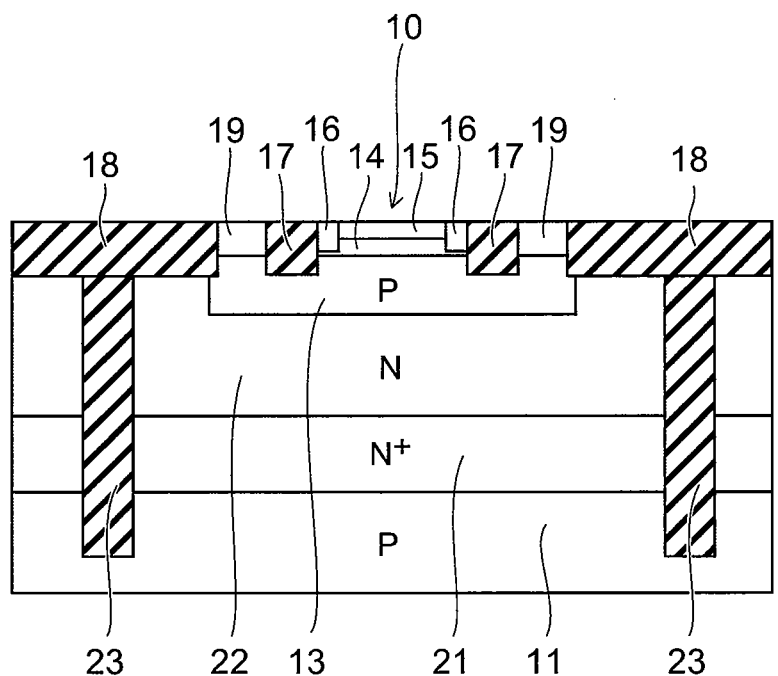
FIG. 2B is a schematic cross-sectional view of a semiconductor device of a third embodiment.

FIG. 2B is a schematic cross-sectional view of a semiconductor device of a third embodiment.

The n-type buried layer 21 is provided on the substrate 11, and an n-type semiconductor layer (n-type epitaxial layer) 22 having a lower n-type impurity concentration than the n-type buried layer 21 is provided on the n-type buried layer 21. The Zener diode 10 is provided on the surface of the n-type semiconductor layer 22.

The n-type buried layer 21 cuts off the electrical connection via the substrate 11 between the Zener diode 10 and other elements that are provided on the same substrate 11.

An isolation layer 23 isolating the Zener diode 10 and the other elements is provided under the isolation layer 18. The isolation layer 23 has a deep trench isolation (DTI) structure in which an insulator (e.g. silicon oxide) is provided in a trench that is deeper than the trench of the isolation layers 17 and 18 and reaches the substrate 11.

Fourth Embodiment

Figure 3:
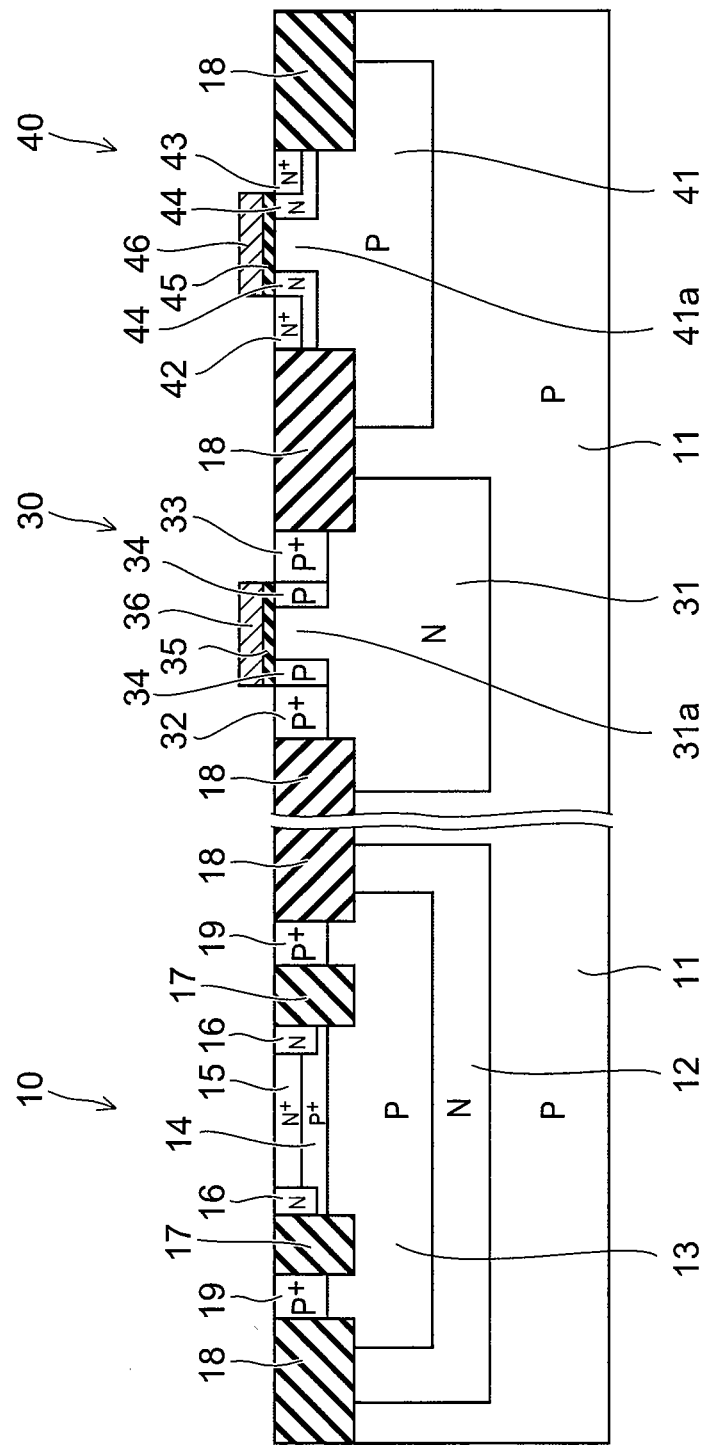
FIG. 3 is a schematic cross-sectional view of a semiconductor device of a fourth embodiment.

FIG. 3 is a schematic cross-sectional view of a semiconductor device of a fourth embodiment.

The semiconductor device of the fourth embodiment has a structure in which the Zener diode 10, a first transistor 30, and a second transistor 40 are provided on the same substrate 11.

Although the region where the Zener diode 10 is provided has the same structure as, for example, FIG. 2A, also the structures of other embodiments can be used.

The first transistor 30 has a p-type metal-oxide-semiconductor field effect transistor (MOSFET) structure.

The first transistor 30 includes an n-type well layer 31 provided on the top surface side of the substrate 11, and a p-type source layer 32, a p-type drain layer 33, and a p-type semiconductor layer 34 provided on the surface of the n-type well layer 31.

The p-type source layer 32 and the p-type drain layer 33 are away from each other across an n-type channel region 31a provided at the surface of the n-type well layer 31. The positional relationship between the p-type source layer 32 and the p-type drain layer 33 may be opposite to the illustration.

The p-type semiconductor layer 34 is adjacent to the n-type channel region 31a side of the p-type source layer 32. The p-type semiconductor layer 34 is adjacent also to the n-type channel region 31a side of the p-type drain layer 33.

The n-type channel region 31a is formed between the p-type semiconductor layers 34. A gate electrode 36 is provided above the n-type channel region 31a via a gate insulating film 35. When a desired gate voltage is applied to the gate electrode 36, a p-type inversion layer is formed in the n-type channel region 31a.

The p-type impurity concentration of the p-type semiconductor layer 34 is lower than the p-type impurity concentration of the p-type source layer 32 and the p-type impurity concentration of the p-type drain layer 33. Thereby, electric field concentration at the end on the gate electrode 36 side of the p-type source layer 32 and the end on the gate electrode 36 side of the p-type drain layer 33 can be suppressed.

The second transistor 40 has an n-type MOSFET structure.

The second transistor 40 includes a p-type well layer 41 provided on the top surface side of the substrate 11, and an n-type source layer 42, an n-type drain layer 43, and an n-type semiconductor layer 44 provided on the surface of the p-type well layer 41.

The n-type source layer 42 and the n-type drain layer 43 are away from each other across a p-type channel region 41a provided at the surface of the p-type well layer 41. The positional relationship between the n-type source layer 42 and the n-type drain layer 43 may be opposite to the illustration.

The n-type semiconductor layer 44 is adjacent to the p-type channel region 41a side of the n-type source layer 42. The n-type semiconductor layer 44 is adjacent also to the p-type channel region 41a side of the n-type drain layer 43.

The p-type channel region 41a is formed between the n-type semiconductor layers 44. A gate electrode 46 is provided above the p-type channel region 41a via a gate insulating film 45. When a desired gate voltage is applied to the gate electrode 46, an n-type inversion layer is formed in the p-type channel region 41a.

The n-type impurity concentration of the n-type semiconductor layer 44 is lower than the n-type impurity concentration of the n-type source layer 42 and the n-type impurity concentration of the n-type drain layer 43. Thereby, electric field concentration at the end on the gate electrode 46 side of the n-type source layer 42 and the end on the gate electrode 46 side of the n-type drain layer 43 can be suppressed.

The Zener diode 10, the first transistor 30, and the second transistor 40 are isolated from one another by the isolation layer 18.

Next, a method for manufacturing a semiconductor device of the fourth embodiment is described with reference to FIG. 4A to FIG. 5B.

Figure 4A:
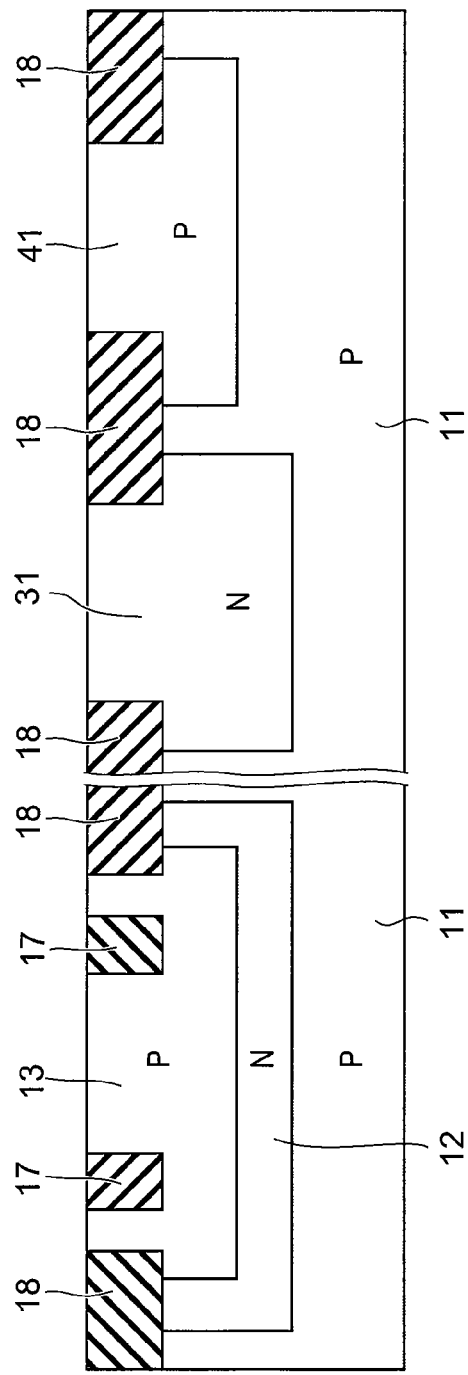

As shown in FIG. 4A, the isolation layers 17 and 18 of, for example, an STI structure are formed on the top surface side of the substrate 11, and then each well layer is formed by the ion implantation method.

The n-type well layer 12 and the n-type well layer 31 are formed simultaneously by, for example, implanting and diffusing an n-type impurity such as phosphorus, arsenic, and antimony. Therefore, the n-type impurity concentration of the n-type well layer 12 and the n-type impurity concentration of the n-type well layer 31 are the same.

Furthermore, the n-type well layer 13 and the n-type well layer 41 are formed simultaneously by, for example, implanting and diffusing a n-type impurity such as boron. Therefore, the n-type impurity concentration of the n-type well layer 13 and the n-type impurity concentration of the n-type well layer 41 are the same.

Figure 4B:
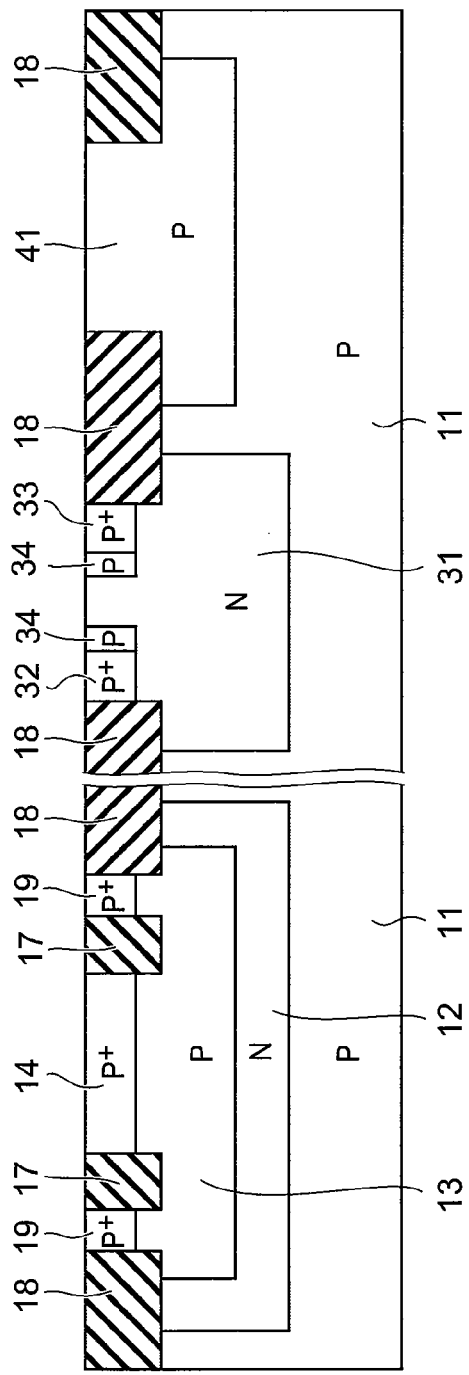

Next, as shown in FIG. 4B, the p-type anode layer 14, the p-type semiconductor layer 19, the p-type source layer 32, the p-type drain layer 33, and the p-type semiconductor layer 34 are formed by, for example, implanting and diffusing a p-type impurity such as boron.

The p-type anode layer 14, the p-type semiconductor layer 19, the p-type source layer 32, and the p-type drain layer 33 are formed simultaneously. Therefore, the p-type impurity concentration of the p-type anode layer 14, the p-type impurity concentration of the p-type semiconductor layer 19, the p-type impurity concentration of the p-type source layer 32, and the p-type impurity concentration of the p-type drain layer 33 are the same.

Next, as shown in FIG. 5A, the n-type guard ring layer 16 and the n-type semiconductor layer 44 are formed by, for example, implanting and diffusing an n-type impurity such as phosphorus, arsenic, and antimony.

The n-type guard ring layer 16 and the n-type semiconductor layer 44 are formed simultaneously. Therefore, the n-type impurity concentration of the n-type guard ring layer 16 and the n-type impurity concentration of the n-type semiconductor layer 44 are the same.

Next, as shown in FIG. 5B, the n-type anode layer 15, the n-type source layer 42, and the n-type drain layer 43 are formed by, for example, implanting and diffusing an n-type impurity such as phosphorus, arsenic, and antimony.

The n-type anode layer 15, the n-type source layer 42, and the n-type drain layer 43 are formed simultaneously. Therefore, the n-type impurity concentration of the n-type anode layer 15, the n-type impurity concentration of the n-type source layer 42, and the n-type impurity concentration of the n-type drain layer 43 are the same.

The order of the ion implantation processes mentioned above may be altered as appropriate. For example, the ion implantation for the p-type anode layer 14, the p-type semiconductor layer 19, the p-type source layer 32, and the p-type drain layer 33 may be performed after the ion implantation for the n-type guard ring layer 16 and the n-type semiconductor layer 44.

By the embodiment, the impurity diffusion layers of the Zener diode 10 can be formed in the same processes as the impurity diffusion layers of the first transistor 30 and the impurity diffusion layers of the second transistor 40. Including the isolation layers 17 and 18, all the components of the Zener diode 10 can be formed in processes in common with the processes of forming the first transistor 30 or the processes of forming the second transistor 40. Thus, the manufacturing processes can be shortened and the manufacturing costs can be reduced.

Fifth Embodiment

FIG. 6A is a schematic cross-sectional view of a semiconductor device of a fifth embodiment.

The n-type buried layer 21 is provided on the substrate 11, and the n-type semiconductor layer (n-type epitaxial layer) 22 having a lower n-type impurity concentration than the n-type buried layer 21 is provided on the n-type buried layer 21. The Zener diode 10 is provided on the surface of the n-type semiconductor layer 22.

The isolation layer 23 of a DTI structure isolating the Zener diode 10 and other elements, a p-type isolation layer 24, and a p-type buried layer 25 are provided under the isolation layer 18 provided at the surface.

The p-type buried layer 25 is buried at almost the same depth as the n-type buried layer 21 between an n-type buried layer 21 and an n-type buried layer 21, and is buried near the joint surface between the p-type substrate 11 and the n-type semiconductor layer 22. The p-type isolation layer 24 is provided on the p-type buried layer 25, and the upper surface of the p-type isolation layer 24 reaches the isolation layer 18.

Sixth Embodiment

FIG. 6B is a schematic cross-sectional view of a semiconductor device of a sixth embodiment.

The semiconductor device of the sixth embodiment differs from the semiconductor device of the fifth embodiment in not including the isolation layer 23 of a DTI structure.

By a Zener diode of at least one of the embodiments described above, variation in breakdown voltage can be suppressed while downsizing is achieved. Thus, the Zener diode is suitable for integration with other elements such as a transistor.

When the n-type guard ring layer 16 is formed deeper than the n-type cathode layer 15, a leak due to the p-n junction becoming shallow near the sidewall (edge) of the isolation layer 17 can be suppressed. Therefore, it is possible for the n-type guard ring layer 16 to have an n-type impurity concentration approximately equal to the n-type impurity concentration of the n-type cathode layer 15. However, an n-type impurity diffusion layer of a low concentration can be formed in a deep position more easily because of the present situation, constraints in process terms, etc.

A p-type impurity, for example boron, can be implanted into a deep position more easily than an n-type impurity such as phosphorus, arsenic, and antimony. Therefore, a p-n junction structure in which the n-type cathode layer 15 is provided on the p-type anode layer 14 can be formed more easily than a p-n junction structure in which the p-type anode layer 14 is formed on the n-type cathode layer 15.

In a structure in which the p-type anode layer 14 is provided under the n-type cathode layer 15, the p-type semiconductor layer 19 electrically connected to the p-type anode layer 14 via the p-type well layer 13 may be provided on the top surface side like the embodiments described above; thereby, also the p-type anode layer 14 can be connected to an electrode on the top surface side similarly to the n-type cathode layer 15, and the electrode extraction structure on the anode side is simplified.

The isolation layer 17 needs only to be deeper than the p-n junction of the n-type cathode layer 15 and the p-type anode layer 14 where breakdown will occur, that is, be deeper than the n-type cathode layer 15. Furthermore, the isolation layer 17 may be deeper than the p-type anode layer 14; thereby, the Zener diode 10 can be dielectrically isolated from other elements formed on the same substrate with reliability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A diode comprising:
    a first semiconductor layer of a first conductivity type;
    a second semiconductor layer of a first conductivity type provided on the first semiconductor layer;
    a third semiconductor layer of a second conductivity type provided on the second semiconductor layer to be joined to the second semiconductor layer;
    an insulating layer surrounding a periphery of the third semiconductor layer and being deeper than the third semiconductor layer; and
    a guard ring layer of the second conductivity type provided between the third semiconductor layer and the insulating layer, being adjacent to the third semiconductor layer, and being deeper than the third semiconductor layer, the guard ring layer adjoining the insulating layer.

2. The diode according to claim 1, wherein the guard ring layer continuously surrounds the third semiconductor layer.

3. The diode according to claim 1, wherein a second conductivity type impurity concentration of the guard ring layer is lower than a second conductivity type impurity concentration of the third semiconductor layer.

4. The diode according to claim 1, wherein the insulating layer is deeper than the second semiconductor layer.

5. The diode according to claim 1, wherein the insulating layer completely fills a trench formed on a top surface side of the diode.

6. The diode according to claim 1, wherein a first conductivity type impurity concentration of the second semiconductor layer is higher than a first conductivity type impurity concentration of the first semiconductor layer.

7. The diode according to claim 1, further comprising a fourth semiconductor layer of a first conductivity type provided on the first semiconductor layer on an opposite side of the insulating layer from a region including the third semiconductor layer and the guard ring layer.

8. The diode according to claim 7, wherein an impurity concentration of the fourth semiconductor layer is higher than an impurity concentration of the first semiconductor layer.

9. The diode according to claim 7, wherein the second semiconductor layer and the fourth semiconductor layer have a same depth and a same impurity concentration.

10. The diode according to claim 1, wherein the guard ring layer is provided on an entirety of a side surface of the third semiconductor layer and the side surface of the third semiconductor layer is not in contact with the second semiconductor layer.

11. The diode according to claim 1, wherein a P-N junction of the second semiconductor layer and the third semiconductor layer is formed only directly under the third semiconductor layer.

12. The diode according to claim 1, wherein an impurity concentration of the second semiconductor layer and an impurity concentration of the third semiconductor layer are $1 \times 10^{20}$ to $1 \times 10^{21}$ $(cm^{-3})$.

13. The diode according to claim 1, wherein an impurity concentration of the guard ring layer is $1 \times 10^{18}$ to $1 \times 10^{19}$ $(cm^{-3})$.

14. The diode according to claim 1, wherein the first conductivity type is a P type and the second conductivity type is an N type.

15. The diode according to claim 1, wherein the diode is a Zener diode.

16. The diode according to claim 15, wherein breakdown occurs earlier at a P-N junction of the second semiconductor layer and the third semiconductor layer than at a P-N junction of the second semiconductor layer and the guard ring layer.

17. A semiconductor device comprising: a substrate; a diode provided on the substrate; a first transistor provided on the substrate; and a second transistor provided on the substrate, the diode including:
    a first semiconductor layer of a first conductivity type provided on the substrate;
    a second semiconductor layer of the first conductivity type provided on the first semiconductor layer;
    a third semiconductor layer of a second conductivity type provided on the second semiconductor layer to be joined to the second semiconductor layer;
    an insulating layer surrounding a periphery of the third semiconductor layer and being deeper than the third semiconductor layer; and
    a guard ring layer of the second conductivity type provided between the third semiconductor layer and the insulating layer, being adjacent to the third semiconductor layer, and being deeper than the third semiconductor layer, the guard ring layer adjoining the insulating layer, the first transistor including:
    a first conductivity type source layer;
    a first conductivity type drain layer;
    a second conductivity type channel region provided between the first conductivity type source layer and the first conductivity type drain layer;
    a first gate insulating film provided on the second conductivity type channel region; and
    a first gate electrode provided on the first gate insulating film, the second transistor including:
    a second conductivity type source layer;
    a second conductivity type drain layer;

a first conductivity type channel region provided between the second conductivity type source layer and the second conductivity type drain layer;

a second gate insulating film provided on the first conductivity type channel region; and a second gate electrode provided on the second gate insulating film.

18. The device according to claim 17, wherein the second semiconductor layer, the first conductivity type source layer, and the first conductivity type drain layer have a same first conductivity type impurity concentration, and the third semiconductor layer, the second conductivity type source layer, and the second conductivity type drain layer have a same second conductivity type impurity concentration.

19. The device according to claim 17, wherein the second transistor further includes a second conductivity type semiconductor layer being adjacent to the second conductivity type source layer on a side facing the first conductivity type channel region and to the second conductivity type drain layer on a side facing the first conductivity type channel region and having a same second conductivity type impurity concentration as the guard ring layer of the diode.

* * * * *